(12) United States Patent
Takemori

(10) Patent No.: US 12,162,110 B2
(45) Date of Patent: Dec. 10, 2024

(54) SAMPLE HOLDER

(71) Applicant: KYOCERA Corporation, Kyoto (JP)

(72) Inventor: Hiromasa Takemori, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 756 days.

(21) Appl. No.: 17/296,719

(22) PCT Filed: Nov. 28, 2019

(86) PCT No.: PCT/JP2019/046640
§ 371 (c)(1),
(2) Date: May 25, 2021

(87) PCT Pub. No.: WO2020/111194
PCT Pub. Date: Jun. 4, 2020

(65) Prior Publication Data
US 2022/0028719 A1    Jan. 27, 2022

(30) Foreign Application Priority Data

Nov. 30, 2018  (JP) ................................. 2018-225129

(51) Int. Cl.
*H01L 21/683* (2006.01)
*B23Q 3/15* (2006.01)
*H01J 37/32* (2006.01)

(52) U.S. Cl.
CPC ............ *B23Q 3/15* (2013.01); *H01L 21/6831* (2013.01); *H01J 37/32715* (2013.01); *H01J 2237/2007* (2013.01); *H01L 21/6833* (2013.01)

(58) Field of Classification Search
None
See application file for complete search history.

(56) References Cited

U.S. PATENT DOCUMENTS

| 9,240,340 B2 * | 1/2016 | Shiraiwa | H01L 21/6833 |
| 9,589,823 B2 * | 3/2017 | Sasaki | H01J 37/32715 |
| 2014/0346152 A1 * | 11/2014 | Sasaki | H01J 37/32715 219/121.58 |

FOREIGN PATENT DOCUMENTS

| JP | 2004-031665 A | 1/2004 |
| JP | 2016-028448 A | 2/2016 |

(Continued)

OTHER PUBLICATIONS

Installation Table, Plasma Processing Device and Method for Manufacturing Installation Table; Document ID: JP 2016028448 A; Inventor Name: Sasaki Yasuharu, Sugamata Takeshi, Aoto Masa; Date Filed: Oct. 22, 2015 (Year: 2016).*

(Continued)

*Primary Examiner* — Mahdi H Nejad
(74) *Attorney, Agent, or Firm* — Volpe Koenig

(57) ABSTRACT

Provided is a sample holder capable of reducing thermal stress developed between an insulating sleeve and a metallic support. A sample holder includes: an insulating base including a sample holding face; and a support joined to the insulating base, a through hole provided in the insulating base and a hole part provided in the support communicate with each other to constitute a gas inflow hole. A tubular sleeve is situated in the hole part, and an annular member located between an outer peripheral surface of the sleeve and an inner peripheral surface of the hole part is provided. The annular member surrounds the sleeve and secures the sleeve to the support.

6 Claims, 4 Drawing Sheets

(56) References Cited

FOREIGN PATENT DOCUMENTS

| JP | 2020072176 A | * | 5/2020 | |
|---|---|---|---|---|
| JP | 2020109806 A | * | 7/2020 | |
| KR | 10-2014-0107279 A | | 9/2014 | |
| WO | WO-2019082875 A1 | * | 5/2019 | ............... B23Q 3/15 |
| WO | WO-2023189954 A1 | * | 10/2023 | |

OTHER PUBLICATIONS

Sample Holder; Document ID: JP 2021086854 A; Inventor Name: Takemori Hiromasa; Date Filed: Nov. 25, 2019 (Year: 2021).*
Specimen Holding Device; Document ID: CN 111213230 A; Inventor Name: Furukawa, Naoki; Date Filed: Oct. 23, 2018; Date Published: May 29, 2020 (Year: 2020).*
Carrying Platform and Plasma Processing Device; Document ID: CN 107039326 A; Date Published: Aug. 11, 2017; Inventor: Kokura, Shingo; Date Filed: Sep. 23, 2016 (Year: 2017).*
Sample Holder; Patent No. 2023189954; Document ID: WO 2023189954 A1; Date Published: Oct. 5, 2023; Inventor: Kamitani, Satoru; Date Filed: Mar. 22, 2023 (Year: 2023).*

* cited by examiner

SAMPLE HOLDER

CROSS-REFERENCE TO RELATED APPLICATION

This application is a national stage entry according to 35 U.S.C. 371 of International Application No. PCT/JP2019/046640 filed on Nov. 28, 2019, which claims priority to Japanese Patent Application No. 2018-225129 filed on Nov. 30, 2018, the contents of which are entirely incorporated herein by reference.

TECHNICAL FIELD

The present disclosure relates to a sample holder for holding a sample such as a semiconductor wafer, which is used in the process of manufacture of semiconductor integrated circuits or the process of manufacture of liquid crystal displays, for example.

BACKGROUND

An example among heretofore known sample holders designed for use in semiconductor manufacturing equipment, etc. is an electrostatic chuck described in Japanese Unexamined Patent Publication JP-A 2004-31665 (Patent Literature 1). The electrostatic chuck described in JP-A 2004-31665 includes an insulator and a metallic base, and also includes a hole passing through the insulator and the metallic base. The through hole is provided with an insulating sleeve that covers a junction between the insulator and the metallic base.

SUMMARY

The sample holder according to the disclosure includes: a base in plate form including a first principal face serving as a sample holding face and a second principal face, the base including a flow channel extending from the first principal face to the second principal face;

a support including a first principal face joined to the second principal face of the base, the support being provided with a hole part which is open to the first principal face of the support;

a tubular member situated in the hole part, the tubular member provided with a hole communicating with the flow channel;

and an annular member located between an outer peripheral surface of the tubular member and an inner peripheral surface of the hole part, the annular member surrounding the tubular member and securing the tubular member to the support.

BRIEF DESCRIPTION OF DRAWINGS

Other and further objects, features, and advantages of the invention will be more explicit from the following detailed description taken with reference to the drawings wherein.

DETAILED DESCRIPTION

Figure 1:
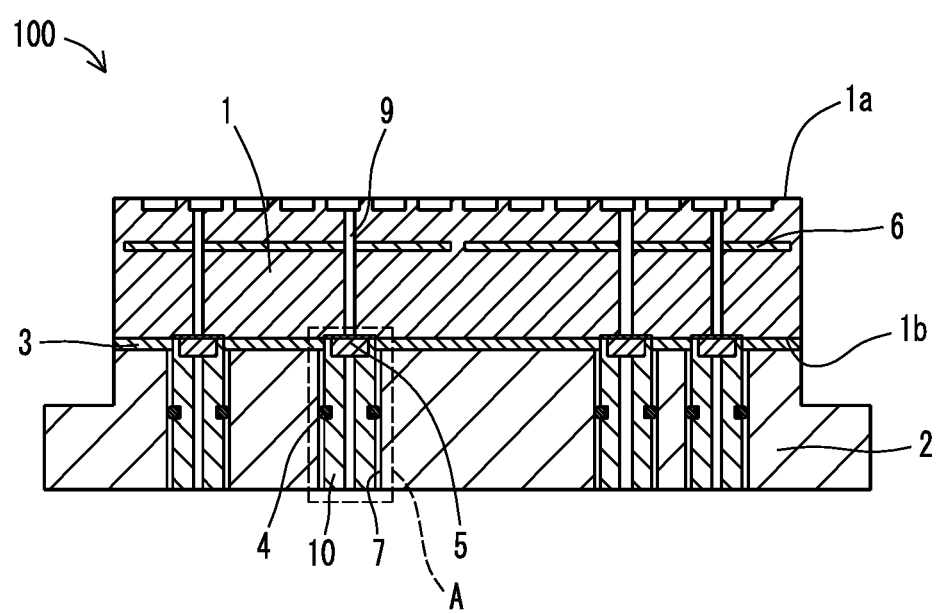
FIG. 1 is a sectional view of a sample holder.

A sample holder 100 will now be described with reference to drawings. FIG. 1 is a sectional view showing one embodiment of the sample holder according to the disclosure. The sample holder 100 includes: an insulating base 1; a support 2; a joining material 3; an annular member 4; a porous member 5; and a sleeve 10.

The insulating base 1 is constructed of a ceramic body having a first face (a first principal face) 1a and a second face (a second principal face) 1b which is opposite to the first face 1a. The first face 1a serves as a sample holding face. The insulating base 1 is made as a plate-like member, the external form of which is not limited to particular shapes. For example, the insulating base 1 may be shaped in a circular plate, or a rectangular plate.

For example, the insulating base 1 is formed of a ceramic material. Examples of the ceramic material include alumina, aluminum nitride, silicon nitride, and yttria. With respect to the outer dimensions of the insulating base 1, for example, the insulating base 1 can be set to 200 to 500 mm in diameter (or side length) and 2 to 15 mm in thickness.

Various methods may be adopted for use as a method for holding a sample via the insulating base 1. The sample holder 100 discussed in this embodiment is built as an electrostatic chuck for holding a sample under an electrostatic force. The sample holder 100 therefore includes an attraction electrode 6 disposed inside the insulating base 1. The attraction electrode 6 includes two electrodes. One of the two electrodes is connected to a positive electrode of a power supply, whereas the other is connected to a negative electrode of the power supply. The two electrodes, each in the form of a substantially semicircular plate, are arranged inside the insulating base 1 such that the chords of their semicircular shapes are opposed to each other. That is, the two electrodes are combined to provide the attraction electrode 6 in the general form of a circle. The center of the circle defining the general form of the attraction electrode 6 may be brought into coincidence with the center of the external form of the identically circular-shaped ceramic body. For example, the attraction electrode 6 contains a metal material. Examples of the metal material include platinum, tungsten, and molybdenum.

For example, the sample holder 100 is used in conditions where plasma is being produced above the first face 1a, which serves as the sample holding face, of the insulating base 1. For example, plasma can be produced by applying high-frequency power between a plurality of electrodes disposed outside the sample holder to cause excitation of gas present between the electrodes.

The support 2 is a metallic member for supporting the insulating base 1. For example, aluminum may be used as the metal material constituting the support 2. The external form of the support 2, which is not limited to particular shapes, may be a circular shape or a quadrangular shape, for example. With respect to the outer dimensions of the support 2, for example, the support 2 can be set to 200 to 500 mm in diameter (or side length) and 10 to 100 mm in thickness. The support 2 may be either identical to or different from the insulating base 1 in respect of external form and outer dimensions.

The support 2 and the insulating base 1 are joined together via the joining material 3. More specifically, a first face 2a of the support 2 is bonded via the joining material 3 to the second face 1b of the insulating base 1. For example, an adhesive formed of a resin material may be used as the joining material 3. As the resin material, for example, silicone resin can be used.

Figure 2:
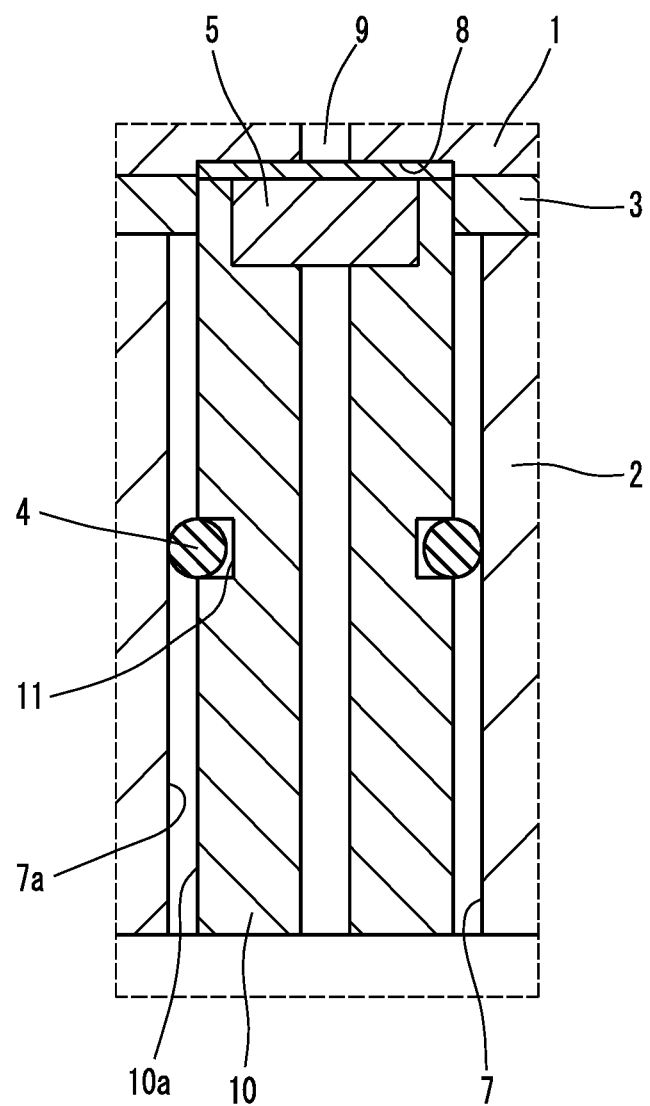
FIG. 2 is a fragmentary sectional view showing a region marked with "A" of the sample holder in enlarged dimension.
Figure 3:
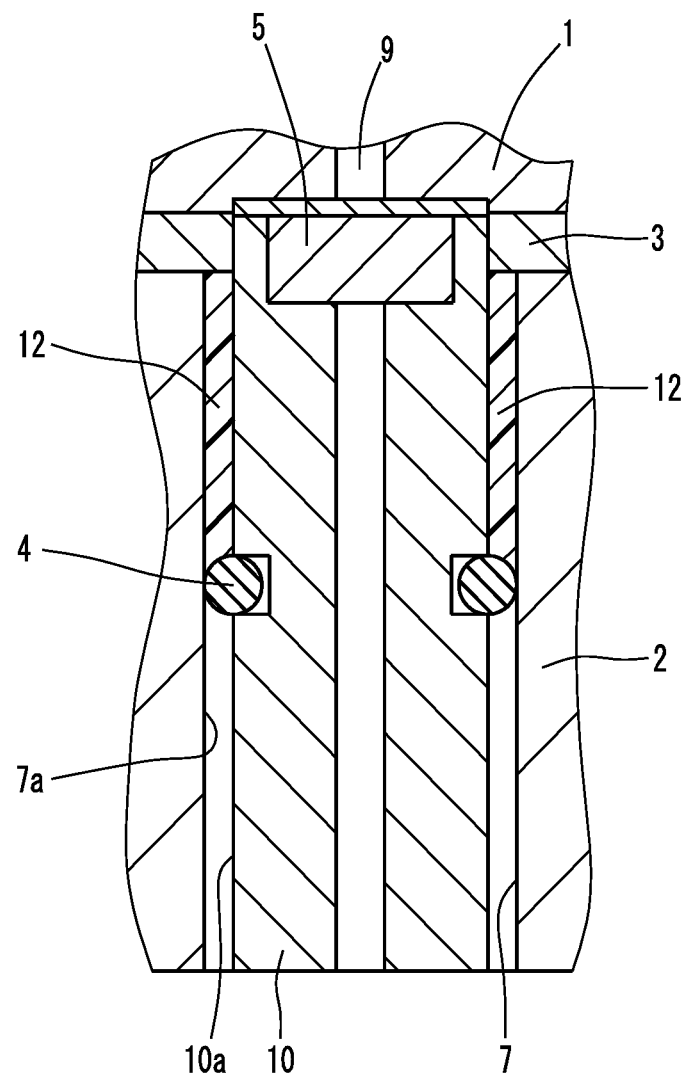
FIG. 3 is an enlarged fragmentary sectional view showing another embodiment of the sample holder.

As shown in FIGS. 2 and 3, the support 2 is provided with a hole part 7 passing through a region from the first face (a first principal face) 2a to a second face (a second principal face) 2b which is opposite to the first face 2a. Moreover, the insulating base 1 is provided with a through hole 9 passing through a region from the first face 1a to the second face 1b. The hole part 7 and the through hole 9 communicate with each other to define a continuous hole extending from the first face 1a of the insulating base 1, through the joining material 3, to the second face 2b of the support 2. For example, the hole part 7 and the through hole 9 are provided to define a gas inflow hole for allowing gas such as helium gas to flow from the second-face 2b side of the support 2 toward the first face 1a, which serves as the sample holding face, of the insulating base 1.

At least in part of the interior of the insulating base 1, the through hole 9 is made smaller in hole diameter than the hole part 7 of the support 7. In the sample holder 100 discussed in this embodiment, the hole part 7 is shaped in a cylindrical column which is uniform in hole diameter throughout its length from the second face 2b to the first face 2a of the support 2. Moreover, in the interior of the insulating base 1, the through hole 9 is shaped in a cylindrical column which is uniform in hole diameter throughout its length from the second face 1b to the first face 1a of the insulating base 1. In this embodiment, the second face 1b of the insulating base 1 is provided with a recess 8 concavely curved toward the first face 1a. The recess 8 is shaped in a cylindrical column which is equal in diameter to the hole part 7, for communication with the hole part 7 of the support 2.

The sample holder 100 includes a sleeve 10 situated in the hole part 7. The sleeve 10 is a tubular member formed of an insulating material in the form of a circular cylinder extending along the central axis of the hole part 7. In the internal space of the hole part 7, the sleeve 10 covers an inner peripheral surface with the metal material exposed. The placement of the sleeve 10 in the hole part 7 permits communication between the interior space of the sleeve 10 and the through hole 9, thereby constituting the gas inflow hole described above.

For example, a ceramic material may be used as the insulating material constituting the sleeve 10. Examples of the ceramic material include alumina and aluminum nitride.

The porous member 5 is provided to, during production of plasma above the first face 1a serving as the sample holding face, prevent the plasma from finding its way into the support 2 through the through hole 9. For example, a porous ceramic material such as porous alumina may be used for the porous member 5. The porous member 5 is situated in the hole part 7. The porous member 5 has a porosity sufficient to permit the passage of gas from an upper surface to a lower surface of the porous member 5. The placement of the porous member 5 in the hole part 7, while permitting the passage of gas through the through hole 9, reduces the chance that the plasma may reach the support 2. For example, the porosity of the porous member 5 can be set to 40 to 60%.

Moreover, an inside diameter at an upper end of the sleeve 10 may be made greater than an inside diameter at a lower end of the sleeve 10. In this case, the porous member 5 may be located on an upper end side of the sleeve 10 so that the porous member 5 is surrounded by the sleeve 10. Thus, even if the plasma reaches the porous member 5, the sleeve 10 can prevent electrical short-circuiting with the support 2.

There may be cases where a held sample is heated for testing or processing purposes. In such a case, in the conventional electrostatic chuck, due to the difference in thermal expansion coefficient between the insulating sleeve and the metallic base, thermal stress is developed between the insulating sleeve and the metallic support, causing problems such as damage to the insulating sleeve.

In this embodiment, an annular member 4 is disposed between an outer peripheral surface 10a of the sleeve 10 and an inner peripheral surface 7a of the hole part 7. The annular member 4 surrounds the sleeve 10 for securing the sleeve 10 to the support 2. The annular member 4 is externally fitted to the sleeve 10 so that the central axis of its annular configuration is located parallel to or coincides with the central axes of the through hole 9 and the sleeve 10. The annular member 4 externally fitted to the sleeve 10 has an outside diameter which is slightly greater than the inside diameter of the hole part 7. With the annular member 4 fitted in the hole part 7, the sleeve 10 is secured via the annular member 4 to the inner peripheral surface 7a of the hole part 7. A gap is provided between the outer peripheral surface 10a of the sleeve 10 and the inner peripheral surface 7a of the hole part 7, thereby keeping non-contact condition between the outer peripheral surface 10a and the inner peripheral surface 7a. With this arrangement, even if the support 2 is subjected to heat during testing or sample processing operation, the annular member 4 can contribute to reduction of thermal stress developed between the outer peripheral surface 10a of the sleeve 10 and the inner peripheral surface 7a of the hole part 7.

As an insulating material constituting the annular member 4, any insulating material that is lower in elastic modulus than the sleeve 10 and the support 2, and is resistant to plasma can be used. Exemplary of the insulating material is fluorine resin. The annular member 4 in the form of a ring is circular in section taken on the plane of section parallel to the central axis. Note that the sectional profile is not limited to a circular shape, and thus the annular member 4 may be given a rectangular or other polygonal sectional profile.

The annular member 4 provides, in addition to the above-described thermal-stress reduction effect, the effect of forming a seal against the leakage of a gas for plasma production, which may occur between the outer peripheral surface 10a of the sleeve 10 and the inner peripheral surface 7a of the hole part 7. As described above, when the support 2 is formed of metal and the sleeve 10 is formed of ceramics, a minute gap tends to appear between the outer peripheral surface 10a and the inner peripheral surface 7a, which may result in gas leakage. The annular member 4 is thus placed to form a seal between the outer peripheral surface 10a and the inner peripheral surface 7a.

The outer peripheral surface 10a of the sleeve 10 is provided with a recess 11, and the annular member 4 is situated in the recess 11. The annular member 4 externally fitted to the sleeve 10 may undergo axial displacement on the outer peripheral surface 10a. With the formation of the recess 11 in the sleeve 10, the annular member 4 can be securely held in the recess 11 so that displacement is prevented.

The hole parts 7 are arranged over the entire surface of the support 2, and can uniformly supply the gas for plasma production to the first face 1a of the insulating base 1. The annular member 4 has a sealing function and can retain the gas that is about to leak out. In the case where the locations of the annular members 4 are deviated in the individual hole parts 7, the amount of leaking gas varies among the hole parts 7, which results in variations in the amounts of the gas to be supplied from the individual hole parts 7 to the first face 1a. To avoid this, the sleeve 10 is provided with the recess 11, and, at this time, a plurality of the individual sleeves 10 are made identical in the location of the recess 11. This can make the individual hole parts 7 uniform in the location of the annular member 4, and make the amounts of the gas supplied from the individual hole parts 7 to the first face 1a uniform.

Figure 4:
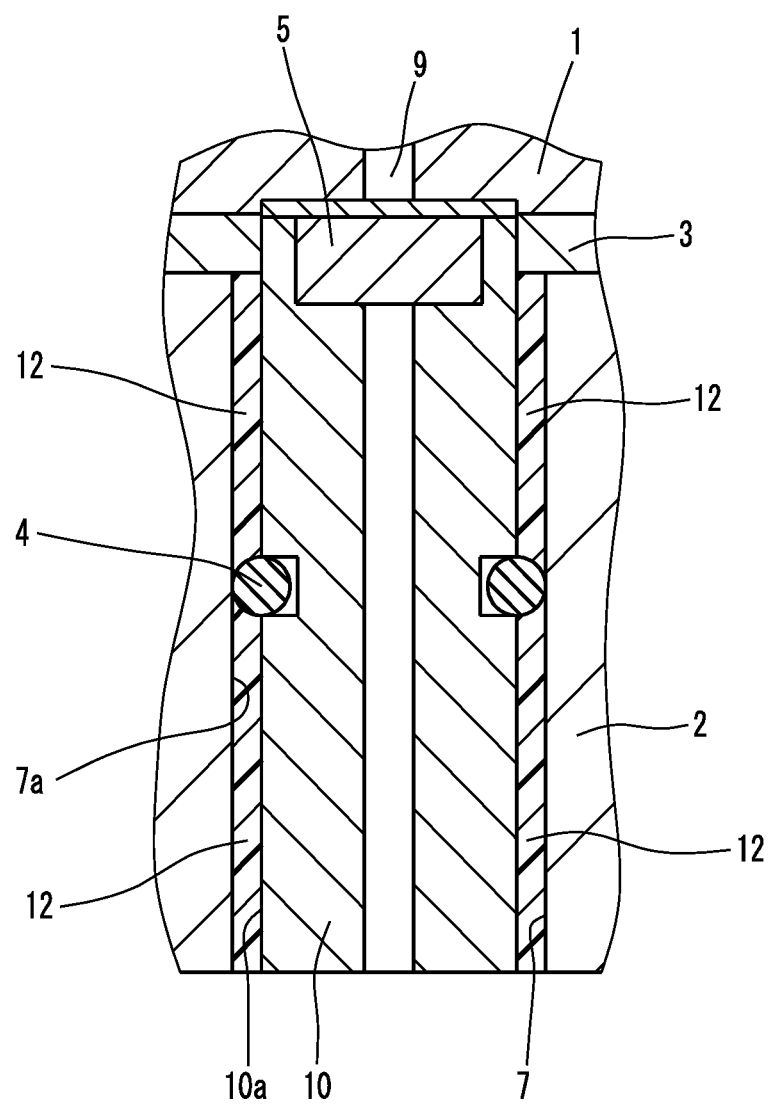
FIG. 4 is an enlarged fragmentary sectional view showing still another embodiment of the sample holder.

FIGS. 3 and 4 are each an enlarged fragmentary sectional view showing another embodiment of the sample holder. In each of the following embodiments, a resin member 12 is placed between the outer peripheral surface 10a of the sleeve 10 and the inner peripheral surface 7a of the hole part 7. Otherwise, these sample holders are structurally identical with the sample holder 100 discussed in the preceding embodiment shown in FIGS. 1 and 2, and the overlapping description will be omitted.

In the embodiment shown in FIG. 3, a part of the inner peripheral surface 7a of the hole part 7, extending from an area of the inner peripheral surface 7a that is close to the insulating base 1 to an area of the inner peripheral surface 7a that is contiguous to the annular member 4, is covered with the resin member 12. In the case where the leakage of the gas for plasma production occurs between the outer peripheral surface 10a of the sleeve 10 and the inner peripheral surface 7a of the hole part 7, chances are high that the gas leaks from the vicinity of the porous member 5. Under such a gas leakage, the resulting plasma causes electrical short-circuiting with the inner peripheral surface 7a of the hole part 7. Thus, the occurrence of electrical short-circuiting can be reduced by covering the upper portion of the inner peripheral surface 7a of the hole part 7 with the resin member 12.

Even if the gap between the outer peripheral surface 10a of the sleeve 10 and the inner peripheral surface 7a of the hole part 7 is filled, since the resin member 12 is lower in elastic modulus than the sleeve 10 and the support 2, the thermal-stress reduction effect is not impaired by the resin member 12.

In the embodiment shown in FIG. 4, the inner peripheral surface 7a of the hole part 7 is wholly covered with the resin member 12. The leakage of the gas for plasma production does not always occur in the upper portion of the inner peripheral surface 7a. Thus, the occurrence of electrical short-circuiting can be reduced by covering the entire inner peripheral surface 7a of the hole part 7. Also in this case, as described just above, even if the gap between the outer peripheral surface 10a of the sleeve 10 and the inner peripheral surface 7a of the hole part 7 is filled, since the resin member 12 is lower in elastic modulus than the sleeve 10 and the support 2, the thermal-stress reduction effect is not impaired by the resin member 12.

The resin member 12 may be formed of any resin material that permits bonding of the sleeve 10 with the support 2. Moreover, the resin member 12 may be formed of the same resin material as that used as the joining material 3 for joining the support 2 and the insulating base 1 together. As the resin material, for example, silicone resin can be used. The use of a common resin material can reduce the risk of debonding at the interface between the resin member 12 and the joining material 3.

The resin member 12 placed between the outer peripheral surface 10a of the sleeve 10 and the inner peripheral surface 7a of the hole part 7 securely holds the sleeve 10 and the annular member 4 together. For example, as described above, the resin member 12 is formed of silicone resin, whereas the annular member 4 is formed of fluorine resin. That is, the resin member 12 is lower in elastic modulus than the annular member 4. This allows the annular member 4 to produce the thermal-stress reduction effect unhindered.

The disclosure may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

REFERENCE SIGNS LIST

1: Insulating base
1a: First face
1b: Second face
2: Support
2a: First face
2b: Second face
3: Joining material
4: Annular member
5: Porous member
6: Attraction electrode
7: Hole part
7a: Inner peripheral surface
8: Recess
9: Through hole
10: Sleeve
10a: Outer peripheral surface
11: Recess
12: Resin member
100: Sample holder

The invention claimed is:

1. A sample holder, comprising:
a base, in plate form, comprising a first principal face serving as a sample holding face and a second principal surface, the base comprising a flow channel extending from the first principal face to the second principal face;
a support comprising a support principal face joined to the second principal face of the base, the support provided with a hole part which is open to the support principal face;
a tubular member situated in the hole part, the tubular member provided with a hole communicating with the flow channel; and
an annular member located between an outer peripheral surface of the tubular member and an inner peripheral surface of the hole part; and
a resin member located in the hole part and extending from an area of the inner peripheral surface that is adjacent to the support principal face to an area of the inner peripheral surface that is contiguous to the annular member,
the annular member surrounding the tubular member and securing the tubular member to the support,
the annular member and the resin member being formed of different materials,
wherein
the tubular member comprises a recess in the outer peripheral surface thereof, and
the annular member is situated in the recess.

2. The sample holder according to claim 1, wherein the annular member is lower in elastic modulus than the tubular member and the support.

3. The sample holder according to claim 1, wherein a gap is provided between the inner peripheral surface of the hole part and the outer peripheral surface of the tubular member.

4. The sample holder according to claim 1, wherein the inner peripheral surface of the hole part is wholly covered with the resin member.

5. The sample holder according to claim 1, wherein the base and the support are joined together via a joining material which is identical to a material constituting the resin member.

6. A sample holder comprising:

a base, in plate form, comprising a first principal face serving as a sample holding face and a second principal surface, the base comprising a flow channel extending from the first principal face to the second principal face;

a support comprising a support principal face joined to the second principal face of the base, the support provided with a hole part which is open to the support principal face;

a tubular member situated in the hole part, the tubular member provided with a hole communicating with the flow channel; and an annular member located between an outer peripheral surface of the tubular member and an inner peripheral surface of the hole part; and a resin member located in the hole part and extending from an area of the inner peripheral surface that is adjacent to the support principal face to an area of the inner peripheral surface that is contiguous to the annular member, the annular member surrounding the tubular member and securing the tubular member to the support, the annular member and the resin member being formed of different materials, wherein the resin member securely holds the tubular member and the annular member together, and the resin member is lower in elastic modulus than the tubular member and the annular member.

* * * * *